United States Patent [19]
Bales et al.

[11] Patent Number: 4,890,237
[45] Date of Patent: Dec. 26, 1989

[54] METHOD AND APPARATUS FOR SIGNAL PROCESSING

[75] Inventors: Robert W. Bales; Lynn T. Olson, both of Portland, Oreg.

[73] Assignee: Tektronix, Inc., Beaverton, Oreg.

[21] Appl. No.: 357,629

[22] Filed: May 25, 1989

Related U.S. Application Data

[63] Continuation of Ser. No. 78,145, Jul. 27, 1987, abandoned.

[51] Int. Cl.$^4$ ............................................. G01R 23/16
[52] U.S. Cl. .............................. 364/485; 364/724.01; 358/138
[58] Field of Search ........................... 364/483–485, 364/724; 358/138

[56] References Cited

U.S. PATENT DOCUMENTS

| | | | |
|---|---|---|---|
| 3,280,257 | 10/1966 | Orthuber et al. | 381/48 |
| 3,971,068 | 7/1976 | Gerhardt et al. | 358/82 |
| 4,310,887 | 1/1982 | Suau | 364/422 |
| 4,335,276 | 6/1982 | Bull et al. | 381/43 |
| 4,471,435 | 9/1984 | Meisner | 364/422 |
| 4,665,494 | 5/1987 | Tanaka et al. | 364/485 |

Primary Examiner—Emanuel S. Kemeny
Attorney, Agent, or Firm—John Smith-Hill; Francis I. Gray

[57] ABSTRACT

A signal processing system for a spectrum analyzer presents a three-dimensional display of a signal in the form of a display of an independent variable, such as frequency, versus a selected property of the signal, such as power, where the selected property is represented as a distribution of values for each independent variable interval in the form of intensity variation on the display. The independent variable is divided into m slots, and the selected property is sampled k times for each slot. A histogram for each slot is built up in a buffer representing the number of samples occurring at each of n power levels. The histogram is transferred to a display memory column by column for each slot, and after all the slots have been processed the display memory is read out onto a display device, such as a CRT, in a raster scan format with the intensity of each pixel element being a function of the number or samples at that power level within that frequency interval.

12 Claims, 1 Drawing Sheet

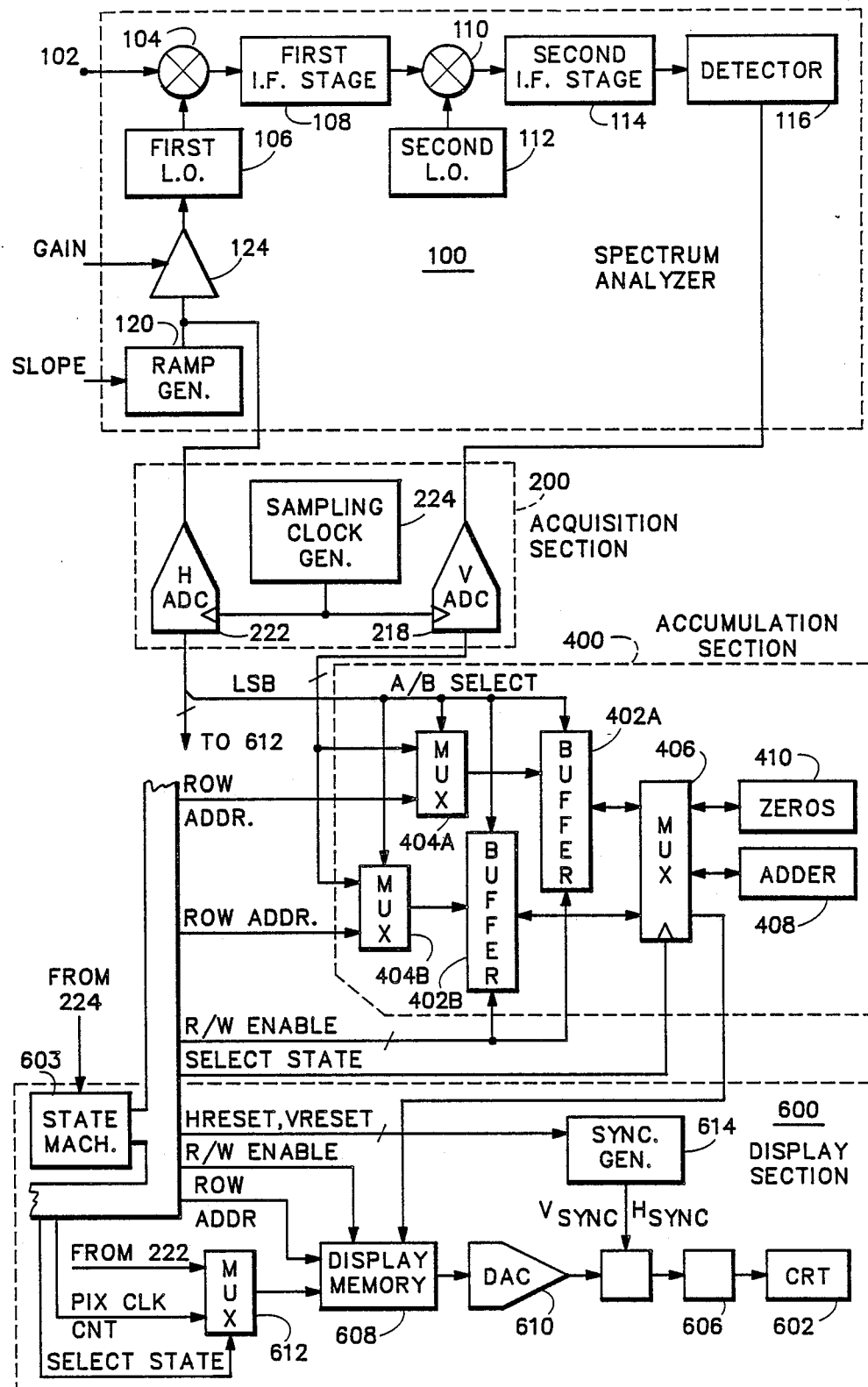

METHOD AND APPARATUS FOR SIGNAL PROCESSING

This is a continuation of application of Ser. No. 078,145 filed July 27, 1987 and now abandoned.

This invention relates to a method and apparatus for signal processing.

BACKGROUND OF THE INVENTION

Spectrum analyzers that are currently available, such as the Tektronix 49X series of spectrum analyzers, provide a display in a rectangular Cartesian coordinate system of values of signal power plotted along a vertical axis and values of signal frequency plotted along a horizontal axis. In a typical spectrum analyzer, the display has 1,000 resolution points in the horizontal direction, each representing a frequency band, and 225 resolution points in the vertical direction, each representing a power band, for a total of 225,000 addressable display points. In the event that the display is provided on the screen of a cathode ray tube (CRT), the display is created by sweeping the electron beam across the screen of the CRT in a succession of vectors from one addressed display point to the next in the direction of increasing frequency.

Current spectrum analyzers have a real time mode of operation and a storage mode. In the storage mode, as few as 11 or as many as 22,000 sample values are generated for each of the horizontal resolution points. Each sample value represents the value of signal power at a frequency in the frequency band represented by the particular horizontal resolution point. However, such spectrum analyzers are limited to providing a display of only a single power value for a given frequency value. Therefore, in the storage mode the multiple power values are processed to yield a single value, e.g. the peak value or the mean value, and this single value is stored and is used to provide the display. Accordingly, the spectrum analyzer's memory has 1,000 memory locations, each of which is capable of storing at least 225 distinct sample values. The display that is provided by a spectrum analyzer operating in the storage mode is stable but does not convey information regarding the distribution of the power levels in a particular frequency band.

In the real-time mode, the display point currently being addressed represents the real-time value of signal power at a particular frequency. For a given frequency band, several power values may be displayed. The intensity of a particular display point depends upon the amount of time for which the input signal has the combination of power and frequency values represented by that point. If the input signal is time-varying, the display that is provided in the real-time mode conveys useful information regarding the distribution of power values in a particular frequency band. However, if the variations in signal power over time are substantial, the display may be disturbing to the user because it is not stable. Also, if the display refresh rate is low, the display is objectionable because it flickers in intensity.

SUMMARY OF THE INVENTION

Accordingly, in a preferred embodiment of the present invention, a spectrum analyzer display presents a signal in a three-dimensional form: frequency intervals along the x-axis; power in dB increments along the y-axis; and power distribution within each frequency interval, representing the number of samples for each frequency interval that fall within each dB increment, along the z-axis as an intensity variation. The frequency interval is an independent variable, such as a repetitive ramp signal, that is sampled at a first rate to generate column, or display slot, addresses. The signal is sampled at a second rate that is an integer multiple of the first rate to generate k row addresses for each column address, each row address corresponding to one of the dB increments. A buffer is accessed by the row addresses for each column, and for each row accessed the value contained at that location is incremented by a predetermined amount so that after k samples the value at each row address represents the number of samples of the signal having that power level during that frequency interval. For each frequency interval the contents of the buffer are transferred as a column to a display memory, and reset to count the samples for the next frequency interval. After all the frequency intervals have been accessed, the contents of the display memory are displayed in a raster scan format on a display device, such as a CRT, to present the three-dimensional form of the signal.

BRIEF DESCRIPTION OF THE DRAWINGS

For a better understanding of the invention, and to show how the same may be carried into effect, reference will now be made, by way of example, to the accompanying drawing, the single FIGURE of which is a block diagram of signal processing apparatus embodying the present invention.

DETAILED DESCRIPTION

The signal processing apparatus illustrated in the drawing includes three major functional sections, namely a data acquisition section 200, a data accumulation section 400, and a display section 600. Other functional sections, such as a controller which controls operation of the three illustrated sections, are not shown because they are not necessary to an understanding of the invention.

The data acquisition section comprises a vertical information digitizer 218 and a horizontal information digitizer 222, which receive and digitize respective signals from a signal source 100. The data acquisition section also comprises a sampling clock generator 224 which provides a sampling clock signal for controlling operation of the digitizers 218 and 222.

The signal source 100 may be of conventional form and is specifically illustrated as a spectrum analyzer having an input terminal 102 at which it receives an input signal to be analyzed. The input signal is mixed in a mixer 104 with the output signal at a frequency $f_{L1}$ of a sweeping local oscillator 106. The output signal of the mixer 104 is applied to a first intermediate frequency filter stage 108, which includes a fixed frequency bandpass filter, to produce an output signal at a frequency in the pass band of the filter. The power level of this signal depends on the power of the input signal at a frequency which depends on the instantaneous frequency of the output signal of the local oscillator 106. A second mixer 110 and a local oscillator 112 having a fixed output frequency are employed to provide an output signal at a frequency that is lower than that of the output signal of the first I.F. stage 108. The output signal from the second mixer 110 is fed to a second intermediate frequency filter and amplifier stage 114. The output of the second I.F. stage is detected by a detector 116 and fed through amplifiers and video processing circuits (not shown) to the digitizer 218 of the data acquisition section.

The spectrum analyzer includes a ramp generator 120 which generates a constant amplitude repetitive ramp signal. The constant amplitude ramp signal is applied to a variable gain amplifier 124, and the variable amplitude ramp signal provided by the amplifier 124 is used to sweep the local oscillator 106. The gain of the amplifier 124 is adjustable under user control. The constant amplitude ramp signal is applied to the digitizer 222. Accordingly, the digital output of the digitizer 222 is representative of the instantaneous frequency of the output signal of the local oscillator 106, scaled in accordance with the gain of the amplifier 124. The output signal provided by the digitizer 218 represents signal power as a function of the frequency represented by the output signal of the digitizer 222.

The slope of the ramp signal provided by the ramp generator 120 is adjustable under the control of the user of the apparatus. Therefore, the frequency increment corresponding to consecutive power sample values is adjustable. The resolution of the digitizer 222 is such that in the time taken for the ramp signal to increase sufficiently for the LSB of the digital frequency signal to change, multiple power samples are taken. The number of power samples taken for each change in the LSB of the frequency signal depends on the slope of the ramp signal and is thus under user control. In the following description it will assumed that 100 power samples are taken for each change in the LSB of the frequency signal, but it will be understood that this value is given by way of example and not limitation.

The display section 600 includes a monitor which incorporates a CRT 602 and a drive circuit 606. The drive circuit 606 responds to a video signal in composite, e.g. NTSC, format by causing the electron beam of the CRT to execute a raster scan of the display surface of the CRT from left to right and top to bottom and by varying the beam current during the active interval of an active line in accordance with the amplitude of the video signal. The raster has 525 lines (of which 480 are active) each having a duration of 63.5 μs (of which about 50 μs is active).

The data accumulation section 400 receives data provided by the vertical digitizer 218, accumulates this data under control of the digital frequency signal provided by the horizontal digitizer, and provides the accumulated data to the display section 600. The display section includes a display memory 608. The data received by the display section from the accumulation section is written into the display memory. Concurrently with writing data into the display memory, data stored in the display memory is read from the display memory and is converted to analog form by a digital-to-analog converter (DAC) 610. The analog output signal of the DAC 610 is combined with horizontal and vertical sync signals to provide the composite video signal that is applied to the drive circuit 606 of the monitor.

The writing of data to the display memory from the accumulation section and the reading of data from the display memory 608 are managed by a state machine 603. The state machine receives the sampling clock signal provided by the sampling clock generator 224. The state machine counts the sampling clock pulses and generates a pixel clock pulse each time the count reaches a predetermined number and then resets to 0. The predetermined number is selected such that the period of the pixel clock signal is 106 ns, corresponding to a frequency of about 9.43 MHz. Each pixel clock period is divided into a read interval, during which data is read from the display memory, and a write interval, during which the display memory is available to receive data written from the accumulation section. The pixel clock pulses are counted in a sequence from 0 to 600 and the pixel clock count is then reset to 0 and a horizontal reset pulse is generated. The period of the horizontal reset signal is 63.5 μs, which is equal to the horizontal line time of an NTSC signal. The horizontal reset pulses are counted in a sequence from 0 to 525 and the horizontal reset count is then reset to 0 and a vertical reset pulse is generated. The horizontal and vertical reset pulses are applied to a sync generator 614 to control generation of the horizontal and vertical sync pulses.

The display memory 608 has 500 columns and 480 rows of memory locations. Each memory location is able to store a digital word. (The term "word" is used herein to describe a binary digital quantity having multiple bits without limitation to any particular number of bits.) The memory 608 is accessed by application of a row address word and a column address word in conjunction with a read or write enable signal. On a write access, the row address word is provided by the state machine 603 and the column address word is the digital frequency signal provided by the digitizer 222. On a read access, the row address word is the horizontal reset count provided by the state machine and the column address word is the pixel clock count provided by the state machine. There is no necessary relationship between the location addressed on a write access and the location addressed on the next read access. A multiplexer 612 is used to select the column address word provided by the digitizer 222 or the state machine 603 depending on whether the memory 608 is in the read or write state.

During successive read accesses, the memory locations of the display memory 608 are scanned a row at a time, synchronously with the scanning of the CRT's display surface. Even-numbered rows are scanned during a first field interval and odd-numbered rows are scanned during the next field interval, in order to provide an interlaced signal. A column address in the range from 501 to 600 or a row address in the range from 480 to 525 is outside the address space of the memory 608, and therefore does not result in selection of a memory location in the memory 608. The ranges of values for the column and row addresses that are outside the address space of the display memory allow time for beam retrace of the CRT. For each address that defines a location within the address space of the display memory, the contents of the addressed location are read from the memory. Therefore the CRT provides a visual representation of the contents of the display memory 608 such that the intensity with which a pixel is illuminated depends on the value of the number stored at the corresponding location of the memory 608. For addresses that are outside the address space of the memory 608, the CRT's electron beam is blanked.

The accumulation section 400 of the spectrum analyzer is connected between the acquisition section 200 and the display section 600 and comprises a pair of buffers 402A and 402B. The buffers are placed in a load state in alternating fashion. Switching of the buffers into the load state is controlled by the least significant bit of the frequency signal provided by the digitizer 222. When the LSB of the frequency signal is 0, the buffer 402A is in the load state, and the buffer 402B is in the load state when the LSB of the frequency signal is 1. When a buffer is in the load state, data representing the distribution of power values in the signal frequency slot represented by the frequency signal are loaded into that buffer. When one buffer enters the load state, the other enters a transfer state. In the transfer state, data, loaded into the buffer when it was in the load state, are transferred from the buffer to the display section and the buffer is cleared. Only 480 write accesses are required to transfer the contents of a buffer to the display memory and clear the buffer, and 480 consecutive write access intervals occupy about 51 $\mu$s. If the sweep rate of the spectrum analyzer is low, each buffer remains in the transfer state for more than 51 $\mu$s. When a buffer first enters the transfer state, the transfer and clear operations are carried out during the first 480 write access intervals, and the buffer then enters a wait state until it is switched to the load state.

Each buffer 402 has 480 memory locations, and each memory location is able to store a digital word of, e.g., 12 bits. Address signals are applied to the buffers 402A and 402B by way of respective multiplexers 404A and 404B.

When the buffer 402A, for example, is in the load state (the LSB of the frequency signal is 0), the multiplexer 404A selects the digital power signal provided by the digitizer 218 as the address signal. In the case of the example in which the frequency signal remains constant for 100 periods of the sampling clock generator, 100 address words, each representing a sampled power value, are provided successively to the buffer 402A by way of the multiplexer 404A. In response to each address word, the number stored at the addressed memory location is read from the buffer 402A and is applied through a multiplexer 406 to an adder 408. In the adder, the number is incremented by a selected amount and is written back through the multiplexer 406 to the same memory location. Thus, when the buffer 402A is switched to the transfer state by a change in the LSB of the frequency signal from 0 to 1, the contents of the buffer 402A represent the distribution of power in the input signal within the frequency slot represented by the digital frequency signal during the time for which the buffer was in the load state. When the buffer 402A is in the transfer state, the contents of the buffer are transferred to one of the columns of the display memory.

The amount by which the adder 408 increments a number received from a buffer 402 before writing the number back to the buffer is adjustable. In particular, at high sweep speeds the amount would be more than at low sweep speeds in order to compensate at least partially for reduction in display brightness that normally occurs at high sweep speeds.

The transfer of data from the accumulation section 400 to the display memory takes place during a succession of write access intervals defined by the pixel clock signal. Thus, during a write access interval which occurs while the buffer 402A is in the transfer state, one of the columns of the display memory 608 is selected in accordance with the digital frequency signal provided by the digitizer 222 and one of the memory locations in that column is selected in accordance with the row address word provided by the state machine. The row address word also selects one of the locations of the buffer 402A. The data value that was accumulated in the selected location of the buffer 402A while it was in the load state is transferred to the selected memory location of the display memory by applying a write enable signal to the display memory 608 and a read enable signal to the buffer 402A. In this manner, the data value stored at the addressed location of the buffer 402A is read through the multiplexer 406 and written into the addressed location of the display memory. When the data value stored at the addressed location of the buffer 402A has been transferred to the display memory 608, a write enable signal is applied to the buffer 402A and the multiplexer 406 selects a buffer 410 which contains all zeros. The contents of the buffer 410 are written into the addressed location, thus clearing that location to zero. This transfer/clear sequence is carried out for all 480 locations of the buffer 402A.

When the contents of the buffer 402A have been transferred to the selected column of the display memory, the buffer 402A switches to the wait state. When the LSB of the frequency signal changes to 0, the buffer 402A switches to the load state once more. The buffer 402B switches to the transfer state and the contents of the buffer 402B are transferred to the next column of the display memory. On successive switches of the buffers to the transfer state, the columns of the display memory are selected in increasing order of the column address word. Since the display memory has 500 columns, each of the buffers 402 is selected 250 times in order to complete the acquisition phase and, in the case of the example discussed above, the contents of the memory 608 represent the values of 50,000 samples.

When all the columns of the display memory have been selected by the digital frequency signal, the column address word wraps around to the beginning of the display memory. The addressing of the display memory and the buffers is controlled so that the contents of the buffer 402A are always transferred to the first column of the display memory. The rate at which the contents of the display memory are replaced depends on the rate at which the ramp generator 120 sweeps the local oscillator 106. However, the sweep rate is not related to the refresh rate of the CRT. The frequency span of the analyzer can be increased without changing the sweep rate by reducing the number of samples that are taken between successive switches in the states of the buffers 402, i.e. reducing the slope of the ramp signal.

The display that is provided by the CRT 602 corresponds to that which is provided by a conventional spectrum analyzer when operated in the real-time mode but the display is stable and does not flicker if the refresh rate of the CRT 602 is sufficiently high, e.g. 60 Hz.

It will be appreciated that the present invention is not restricted to the particular embodiment that has been described and illustrated, and that variations may be made therein without departing from the scope of the invention as defined in the appended claims and equivalents thereof. For example, the invention is not limited to use of a spectrum analyzer as the signal source and may be applied to processing other signals having a relatively low sweep rate. Also, the invention is not restricted to the particular configuration of the signal processing apparatus that has been described with reference to the drawing. In particular, in order to permit the acquisition of signals having higher sweep rates, the contents of the display memory may be incremented directly instead of through use of the accumulation section. In order to reduce the rate at which memory accesses must be made, in the read portion of the read/write cycle multiple data values, e.g. four or eight, may be read from successive locations in a row of the display memory and loaded into a shift register. The data values are read out serially from the shift register and used to create the desired video signal. If the frequency at which read accesses are made is reduced, the duration of the write access interval may be increased to allow the contents of multiple locations in a buffer to be transferred to a column of the display memory during a single write access interval. It is desirable that the accumulation section include a device for detecting when the MSB of a word stored in a location of one of the buffers turns on, in order to avoid wrap-around of words stored in the buffers. The invention is not restricted to generation of a video signal which is compatible with standard broadcast formats. In particular, many computer monitors employ a progressively-scanned, non-interlaced raster. If it were desired to generate a video signal for driving such a monitor, the rows of the display memory would be scanned sequentially and each field would be scanned in the same manner.

We claim:

1. A method of processing a signal to display a selected property of the signal as a function of an independent variable comprises the steps of:
   resolving the independent variable into m intervals;
   resolving a range of values for the selected property into n slices;
   obtaining a plurality of samples of the signal for each interval;
   accumulating for each interval the number of samples having a value for the selected property within each slice; and
   displaying for each interval the slices within which samples were accumulated, the intensity of the display for each such slice being a function of the number of samples accumulated in such slice.

2. A method as recited in claim 1 wherein the independent variable resolving step comprises the step of sampling the independent variable at a first rate to establish the m intervals over a predetermined range of values for the independent variable.

3. A method as recited in claim 2 wherein the range resolving step comprises the step of providing a storage device having n separately addressable locations corresponding to the n slices.

4. A method as recited in claim 3 wherein the obtaining step comprises the step of sampling the signal at a second rate that is an integer multiple of the first rate to obtain k samples per interval, each sample providing an address for the storage device.

5. A method as recited in claim 4 wherein the accumulating step comprises the steps of:
   accessing the storage device location according to the address provided by each sample; and
   incrementing a number within the accessed storage device location by a predetermined amount each time the location is accessed, the resulting number representing the number of times a sample of the signal fell within the slice represented by that location.

6. A method as recited in claim 5 wherein the displaying step comprises the steps of:
   transferring the contents of the storage device to a display storage device having m columns and n rows defining picture elements of a display device; and
   scanning the contents of the storage device in a raster format to display on the display device each picture element within which at least one sample of the signal occurred, the intensity of the display of each picture element being a function of the number of samples accumulated in that picture element.

7. An apparatus for processing a signal to display a selected property of the signal as a function of an independent variable comprises:
   means for resolving the independent variable into m intervals;
   means for resolving a range of values for the selected property into n slices;
   means for obtaining a plurality of samples of the signal for each interval;
   means for accumulating for each interval the number of samples having a value for the selected property within each slice; and
   means for displaying for each interval the slices within which samples were accumulated, the intensity of the display for each such slice being a function of the number of samples accumulated in such slice.

8. An apparatus as recited in claim 7 wherein the independent variable resolving means comprises means for sampling the independent variable at a first rate to establish the m intervals over a predetermined range of values for the independent variable.

9. An apparatus as recited in claim 8 wherein the range resolving means comprises means for providing a storage device having n separately addressable locations corresponding to the n slices.

10. An apparatus as recited in claim 9 wherein the obtaining means comprises means for sampling the signal at a second rate that is an integer multiple of the first rate to obtain k samples per interval, each sample providing an address for the storage device.

11. A method as recited in claim 10 wherein the accumulating means comprises:
   means for accessing the storage device location according to the address provided by each sample; and
   means for incrementing a number within the accessed storage device location by a predetermined amount each time the location is accessed, the resulting number representing the number of times a sample of the signal fell within the slice represented by that location.

12. An apparatus as recited in claim 11 wherein the displaying means comprises:
   means for transferring the contents of the storage device to a display storage device having m columns and n rows defining picture elements of a display device; and
   means for scanning the contents of the storage device in a raster format to display on the display device each picture element within which at least one sample of the signal occurred, the intensity of the display of each picture element being a function of the number of samples accumulated in that picture element.

* * * * *